United States Patent [19]
Galbi et al.

[11] Patent Number: 5,412,613
[45] Date of Patent: May 2, 1995

[54] MEMORY DEVICE HAVING ASYMMETRICAL CAS TO DATA INPUT/OUTPUT MAPPING AND APPLICATIONS THEREOF

[75] Inventors: Duane E. Galbi, Jericho; Michael P. Clinton; Mark W. Kellogg, both of Essex Junction, all of Vt.

[73] Assignee: International Business Machines Corporation, Armonk, N.Y.

[21] Appl. No.: 161,279

[22] Filed: Dec. 6, 1993

[51] Int. Cl.⁶ .............................................. G11C 13/00
[52] U.S. Cl. ................................. 365/230.03; 365/63
[58] Field of Search ............... 365/52, 63, 233, 230.03

[56] References Cited
U.S. PATENT DOCUMENTS 3,560,940  2/1971  Gaensslen ........................... 365/229
3,675,218  7/1972  Sechler ................................ 365/229
5,089,993  2/1992  Neal et al. ............................. 365/63

Primary Examiner—Terrell W. Fears
Attorney, Agent, or Firm—Howard J. Walter, Jr.; James M. Leas

[57] ABSTRACT

A semiconductor memory chip architecture is described implementing of a multi-bit data control function which enables independent control of at least a plurality of data bits via a single control signal. A logically organized memory chip is organized as a $2^n \times 4$ chip in which one control (CAS0) signal enables a single data bit and another control (CAS1) signal enables the remaining three data bits. By organizing data control on chips in this manner, it becomes possible to optimize design modules such that a minimum number of control signals are used.

15 Claims, 7 Drawing Sheets

MEMORY DEVICE HAVING ASYMMETRICAL CAS TO DATA INPUT/OUTPUT MAPPING AND APPLICATIONS THEREOF

FIELD OF THE INVENTION

The present invention relates to semiconductor memory array architectures in which a semiconductor memory array provides more than a single data bit for each chip access cycle, and more particularly to arrays in which subsets of data bits can be accessed independently.

BACKGROUND OF THE INVENTION

In the development of semiconductor memory technology the cost of developing new technology has lead to the practice that each succeeding generation of memory products contains four times the number of memory bits as the proceding generation. For example, the sequence of Dynamic RAM (DRAM) products has followed the geometrical series of 1-Megabit (Mb), 4 Mb, 16 Mb and 64 Mb. (A megabit corresponds to $2^{20}$ or 1,048,576 bits.)

Each generation strives to provide similar functions and organizational features as found in previous generations; however, the compatibility of addressing schemes has dictated that each suceeding generation of Random Access Memory (RAM) utilize additional address input signals to address the increasing number of memory cells found in each suceeding generation of memory devices. The additional address input signals act to increase the memory depth of the DRAM memory device. Because the increase in depth or total addressable memory has out-stripped the utilization of memory at the system level, the historical tradition of providing only a single bit per DRAM chip has been altered to provide different granularity of data bits. For example, a 16 Mb DRAM may be offered in organizations of 16 MbX1, 4 MbX4, 2 MbX8, or even 1 MbX16.(The "Xn" portion of such designation is recited as "by n", such as "by 1.") A X4 chip can be used to replace four X1 chips of the previous generation. These wider I/O chips enable later generations of technology to functionally replace earlier generations without requiring a completely new addressing scheme to be designed.

In fabrication semiconductor memory devices it is a common practice to package a plurality of DRAM chips on a single assembly or sub-assembly called a single in-line package (SIP) or a single in-line memory module (SIMM) in which the memory components are organized to provide accessed memory data to a host processor or system in units known as bytes. Each data byte typically contains eight data bits, where each of the bits is supplied by one output of the plurality of DRAM chips comprising the memory system. The number of bytes which the memory system provides to the host processor, like the granularity of DRAMs, has typically been based on powers of 2. Previous generations of processors have used memory systems that provide two concurrent bytes of information, while present generations of processors typically use memory systems that can provide 4 or 8 concurrent bytes of data. In order to keep the number of memory chips used in the memory system from growing proportionally to the number of concurrent bytes provided, wider I/O DRAM chips are used. Hence, in the 1 Mb memory generation, memory systems were typically built with X1 chips while in the 4 Mb memory generation, memory systems are typically built with X4 memory chips. The organization of SIPs or SIMMs with these wider I/O memory chips has been rather uncomplicated.

In high reliability systems it is preferred to utilize some sort of error detection with or with out error correction in conjunction with memory systems. The simplest way to implement error detection is to add a single "parity" bit to each byte which is a function of all of the bits in a byte. At present, it is common to add a ninth parity bit to eight-bit bytes. The additional bits require a memory system which can accommodate a nine bit byte organizations. This requirement has been met in the past by building the memory system out of multiples of nine X1 chips. However, as stated above, for the memory generations beyond the 1Mb generation, using X1 memory chips causes the total memory contained in the memory system to exceed the amount that can be practically used. Furthermore, a common feature of DRAM memory system organizations is that each nine bit byte can be independently accessible. Thus, even for memory systems which can concurrently provide 4 or 8 bytes of data, each byte must be addressable.

A solution to this granularity problem has been proposed by Neal and Poteet in their U.S. Pat. No. 5,089,993 where they describe two approaches to the above problem. In designing a SIP or SIMM organized as 256K bytes X 36 bits (four 9-bit words), they describe using eight 1 Mb DRAMs organized as 256KX4 and four 256 Kb organized as 256 KbX1 requiring a total of twelve memory chips. A problem associated with this approach is that memory processing and development technology rarely allow the manufacture of different density chips in the same technology. Because memory development trends not only demand a four-fold increase in chip density for each subsequent generation of product but also demand an increase in performance, that is, decreased access time, etc. Thus, it would be rare, indeed, to find a 1 Mb DRAM having the same performance as its 256 Kb predecessor. The proposed combination would be practical only if the 1 Mb DRAMs were operated at the slower rate dictated by the 256 Kb DRAM.

The solution, put forward by Neal and Poteet, uses a plurality of chips all of a common generation of technology, but requires two different memory chip architectures. A new chip design which has the density of 1 Mb is organized as four separate 256 KbX1 memories and is designated as Quad CAS. Each of the four memories on a chip is responsive to a different column address strobe (CAS) input (CAS1...CAS4) and each CASn selects one of four data input/output ports. The solution they describe is intended to work for a memory system which is comprised of a plurality of X4 chips. Extending this solution to a memory system which is comprised of a plurality of X8 (wider I/O) memory chips would require a corresponding increase in the number of seperate CAS inputs for the designated "Quad CAS" chip. Hence, using a plurality of X8 chips would seem to require an eight-way CAS chip.

In each of the above approaches to solving the problem of dealing with a byte size that is not an integer power of two, the solution uses one or more dedicated chips solely to provide the odd ninth data bit.

SUMMARY OF THE INVENTION

It is an object of the subject invention to provide a memory chip data mapping architecture which allows the use of same generation technology memory chips to provide a variety of module organizations.

It is another object of the invention to provide a wide number of module organizations utilizing a minimum number of control signals.

It is yet another object of the invention to provide a memory module with an asymmetric CAS to data I/O chip mapping.

These and other objects of the invention are achieved by implementation of a multi-bit data control function which enables independent control of at least a plurality of data bits via a single control signal. For example, a logically organized memory chip is organized as a $2^N$x 4 chip in which one control (CAS0) signal enables a single data bit and another control (CAS1) signal enables the remaining three data bits. By organizing data control on chips in this manner, it becomes possible to optimize design modules such that a minimum number of control signals are used.

The invention is more fully explained in conjunction with the following more detailed description and accompanying drawings.

DETAILED DESCRIPTION OF THE INVENTION

Figure 1:
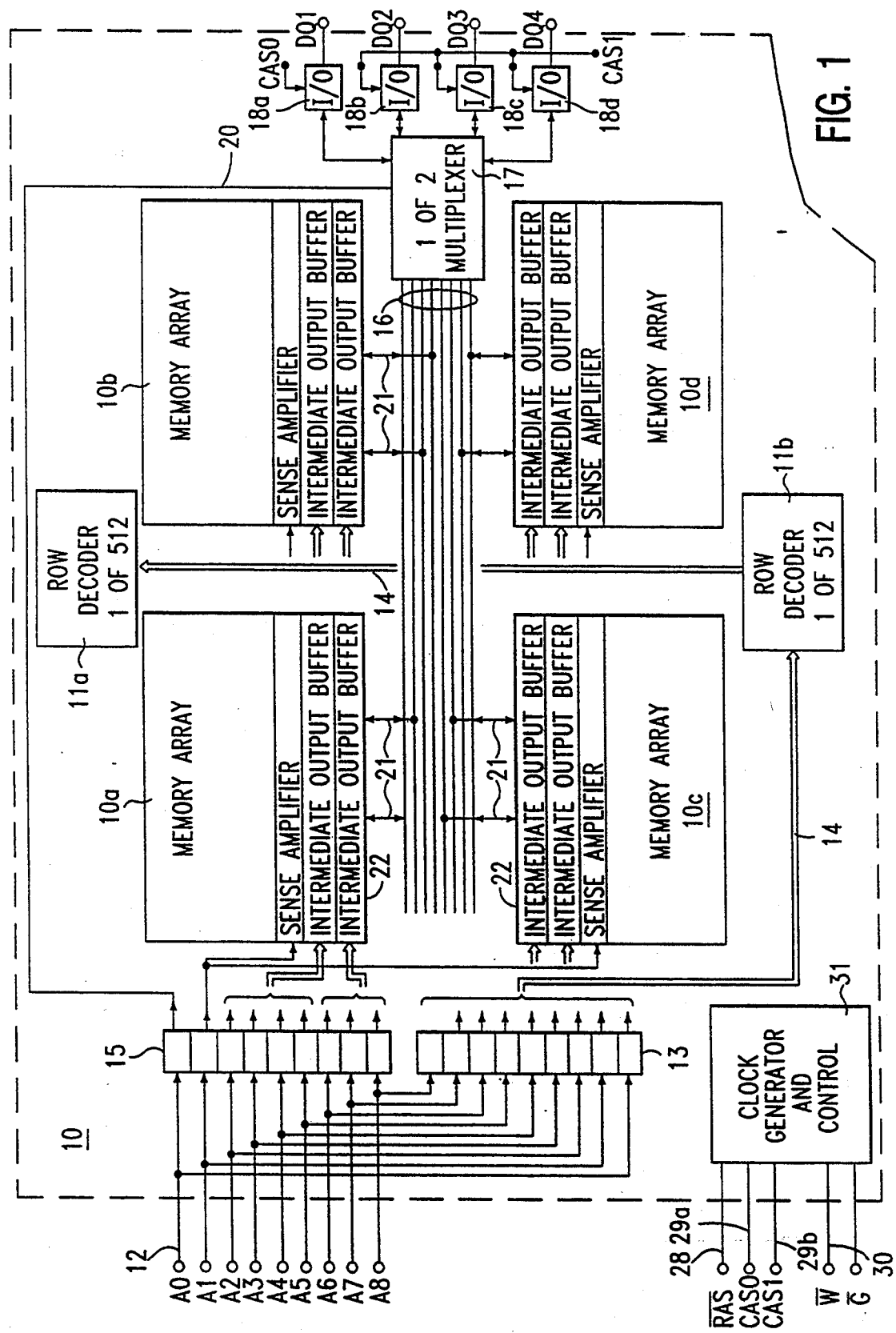
FIG. 1 is a schematic representation of a DRAM memory chip of the invention illustrating the asymmetrical relationship between the data input/output pads and the CAS inputs.

Referring to FIG. 1 there is shown a typical DRAM chip organization illustrating the application of the invention. Although a specific embodiment is shown, any matrix organized memory having at least four data input/output pads can be used to implement the invention. It should be understood the reference to data in and/or data out should be considered inclusive. The actual direction in which data is transferred is not relevant to the subject invention, as it is the control of specific data I/O lines that is significant.

As shown, chip 10 is a 1 Mb DRAM organized as 256KX4 and is responsive to address input signals applied to address inputs 12 in the conventional time division multiplexed manner. During a first portion of an access cycle nine row addresses are applied to row address buffers 13 which apply signals to the two row decoder circuits 11a and 11b, which in turn select row lines in the memory sub-arrays 10a, 10b, 10c and 10d. During a second portion of an access cycle nine column address signals are applied to column address buffers 15 which apply their output signals to a plurality of sense amplifiers, intermediate buffers and multiplexer 17 in order to enable the selection of four specific bits to be coupled through the data I/O buffers 18a–18d. As can be seen, there are two different column address strobe (CAS) signals CAS0 and CAS1 applied to the Clock Generator and Control circuitry 31.

The data I/O buffers are strobed by a CAS signal allowing data to be input or output via one the four data pads DQ0, DQ1, DQ2 and DQ3.

The externally applied CAS signals act as clocking signals to certain portions of the memory chip and are used to initiate internal clock and timing signals on memory chip.

The data I/O buffers are strobed by a CAS signal allowing data to be input or output via one of the four data pads DQ1, DQ2, DQ3 and DQ4. The CAS0 signal is coupled to buffer 18a and controls data bit DQ1. The CAS1 signal is coupled to the three remaining buffers 18b, 18c and 18d and controls data bits DQ2, DQ3, and DQ4.

In normal operation one or two CAS signals can be present, depending on the organization of the data I/O pads of the chips and those of the SIMM. In the case where a single CAS signal is present during a memory cycle, either one or three data bits will be active. In the case where both CAS signals are present, all four bit will be active. To the extent that information is required to further illustrate the specific timing between the various signals applied to the DRAM chip, reference may be made to the above cited prior art patent, which is hereby incorporated by reference.

Figure 2:
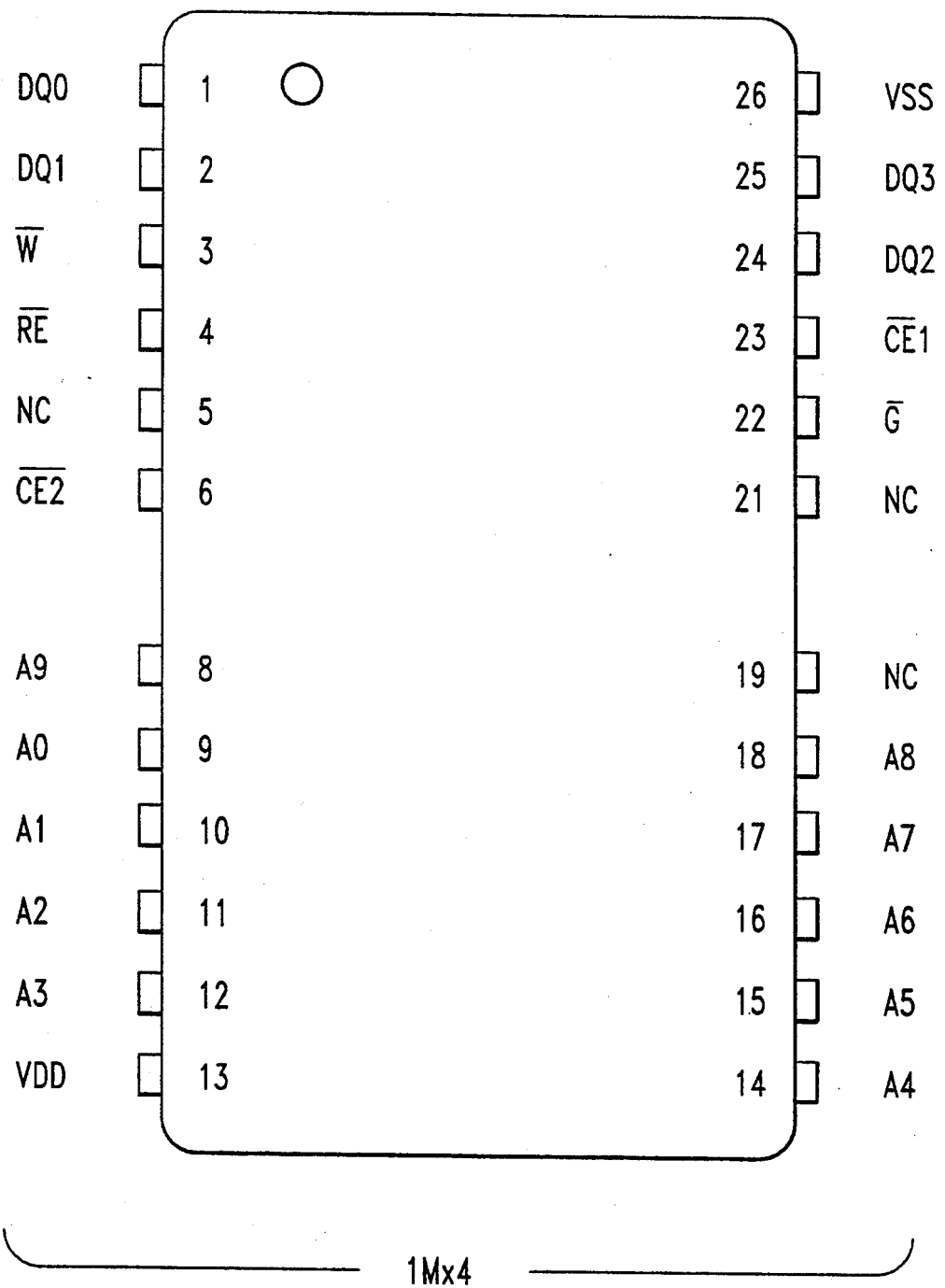
FIG. 2 is a schematic representation of a packaged memory chip of the invention illustrating the I/O and clocking signal pad assignments.
Figure 3:
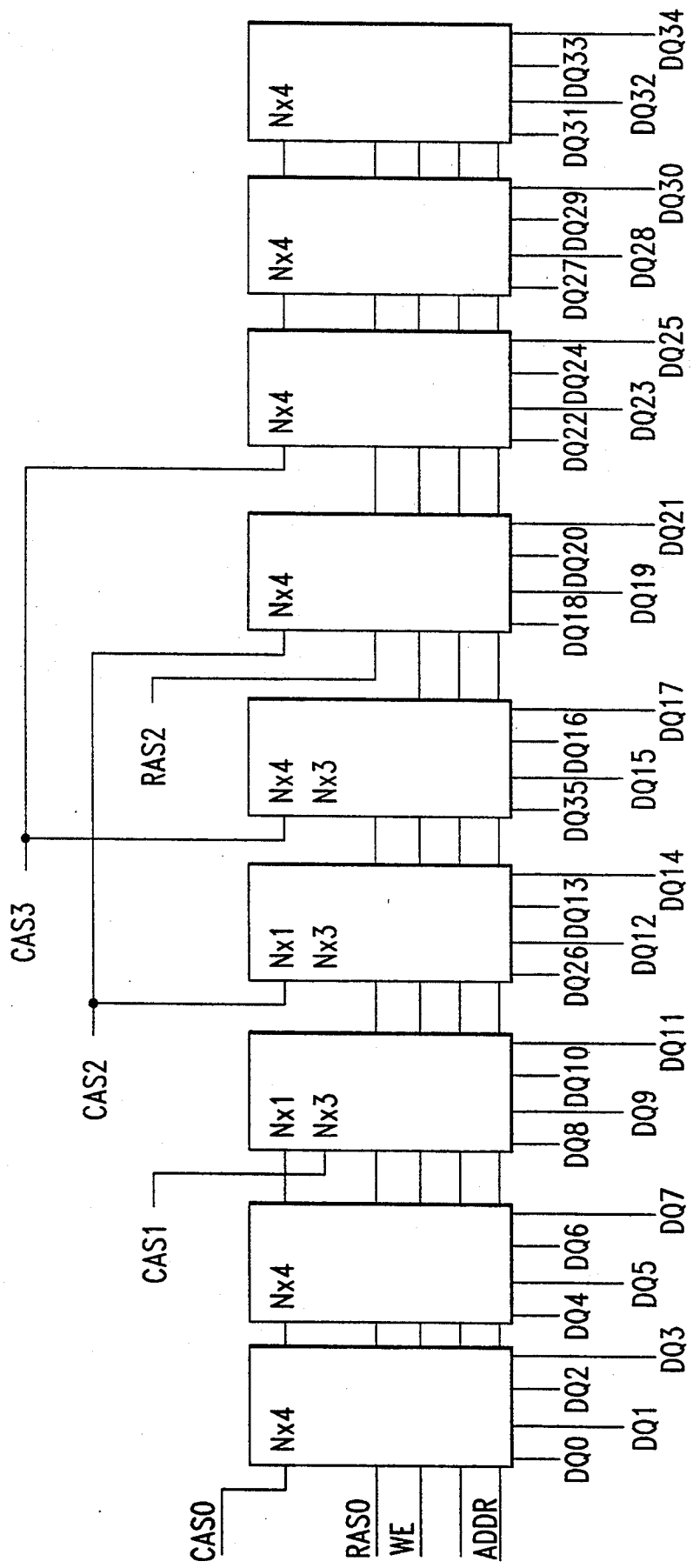
FIG. 3 is a schematic representation of a memory module comprising a plurality of conventional and memory chips of the invention illustrating an application of the invention.

FIG. 2 illustrates a representative package for a 4 Mb memory organized as 1 MbX4 having the two CAS inputs of the same type as the device of FIG. 1. FIG. 3 illustrates an example of a four byte X36 parity 72 pin SIMM architecture using two different types of DRAM chips. Three of the chips are organized as X1 and X3 and the remaining chips are organized as X4 chips. Note that CAS0 controls two X4 chips and the X1 portion of a third chip. CAS1 controls three X3 portions of three chips. In addition, each CAS is asymmetrically balanced to drive three chips.

Additional embodiments in the specific implementation of asymmetrical allocation of CAS signals and data I/O mapping are also possible. For higher density DRAM memories it is expected that chip architecture organizations will include $2^N$x 4, $2^N$x 8, $2^N$x 16 and/or $2^N$x 32 schemes. Where N can be in the range of 16 to 30. When error correction and/or parity bits are required, such data I/O schemes will present the same problems as witnessed in the 256KX4 scheme already referred to. The invention can easily be adapted to such schemes by modifying CAS controlled data I/O schemes to be X5 and X3 for a X8 chip. Other combinations can be easily derived depending on the specific number of bits required to be accessed as a single byte.

Figure 4:
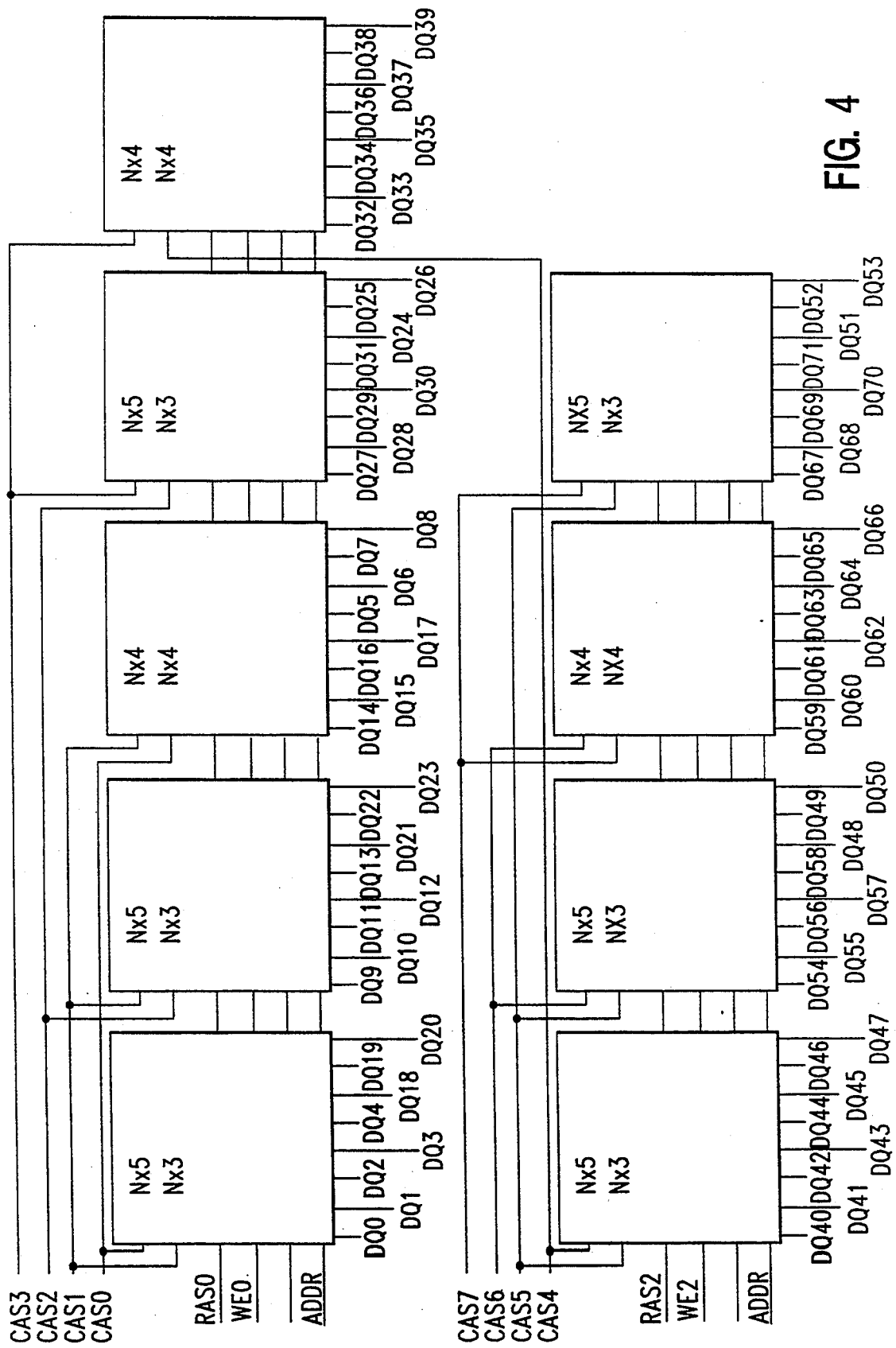
FIG. 4 is a schematic representation of a second embodiment of the invention showing the use of X3, X5 and X8 chip organizations.

FIG. 4 illustrates another embodiment of the invention as an 8 byte, 72 bit parity SIMM and is shown implemented using $2^N$x 8 DRAM architecture using chips configured as $2^N$x 3 and $2^N$x 5 as well as $2^N$x 4 organizations. Combinations of three X3 chips and a X4 and a X5 chip are used to form the required 9-bit byte for each of eight CAS inputs. Using 64 Mb DRAM technology, chip architectures of 8 MbX8 (N=23) configured as 8 MbX3/8 MbX5 and 8 MbX4/8 MbX4 can be used.

Figure 5:
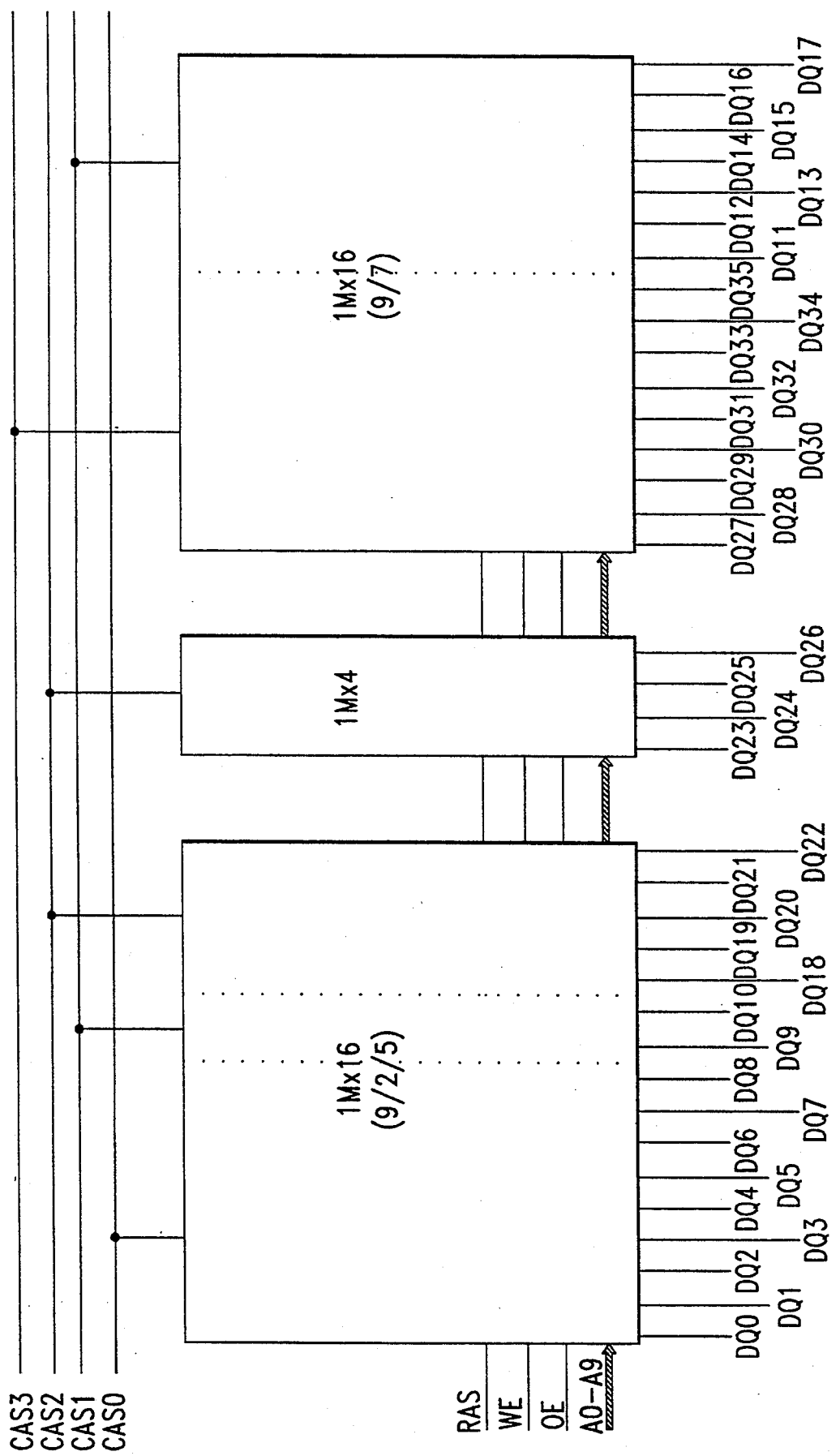
FIG. 5 is a schematic representation of the invention showing another embodiment of asymmetrical data I/O to CAS mapping.

FIG. 5 illustrates another memory system using the invention to create a four byte, 36 bit parity SIMM. It is shown implemented using $2^N$x 16 DRAM architecture using chips configured as $2^N$x 9/X2/X5 as well as $2^N$x 9 and X7 organizations and a $2^N$x 4 from a previous generation to form the required 9-bit byte for each of the four CAS inputs. Using 16 Mb DRAM technology, chip architectures of 1 MbX16 configures as 1 MbX9/X2/X5 and 1 MbX9/7 as well as a 1 MbX4 from the previous generation can be used.

Figure 6:
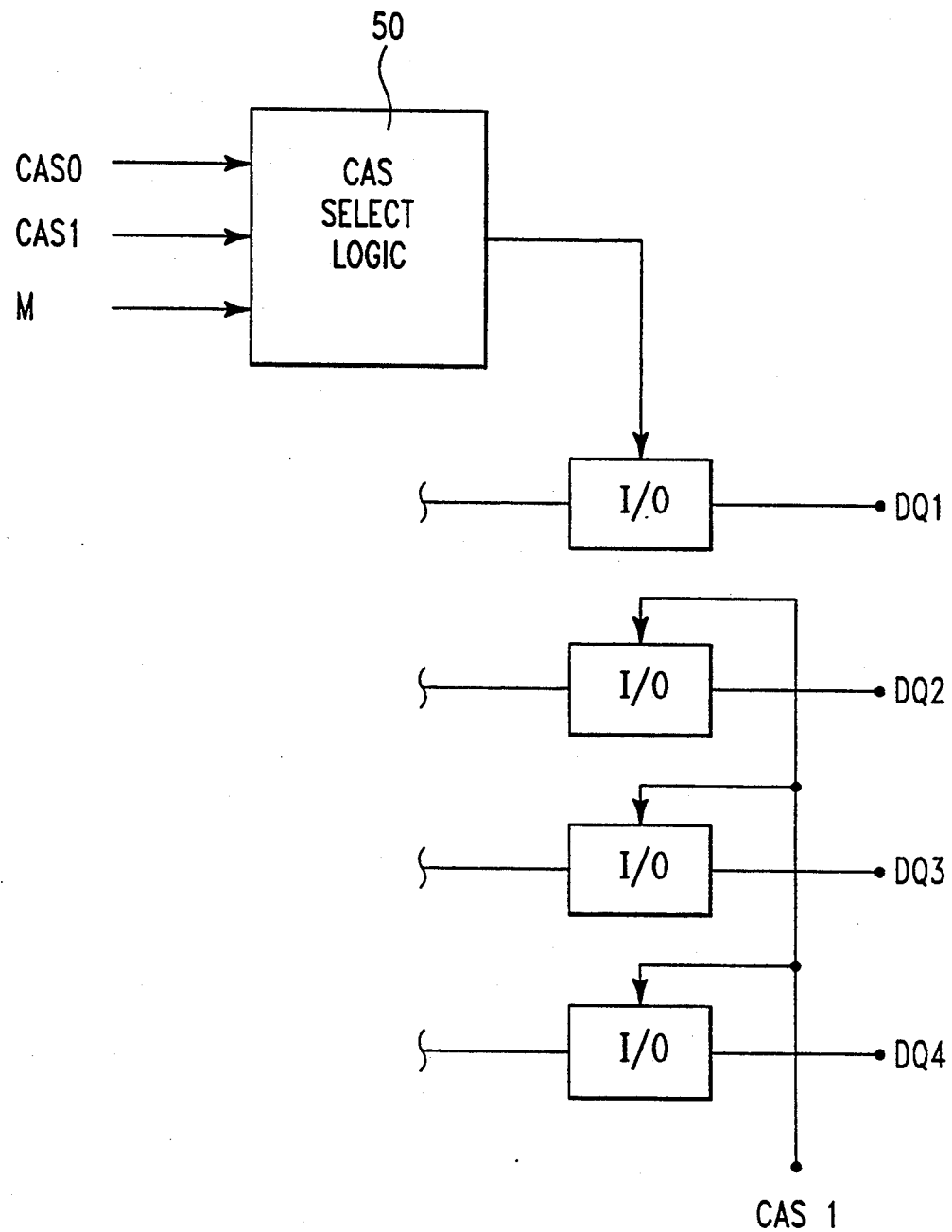
FIG. 6 is a circuit representation of the mode selection circuitry for disabling the asymmetrical data I/O function of the memory of the invention.
Figure 7:
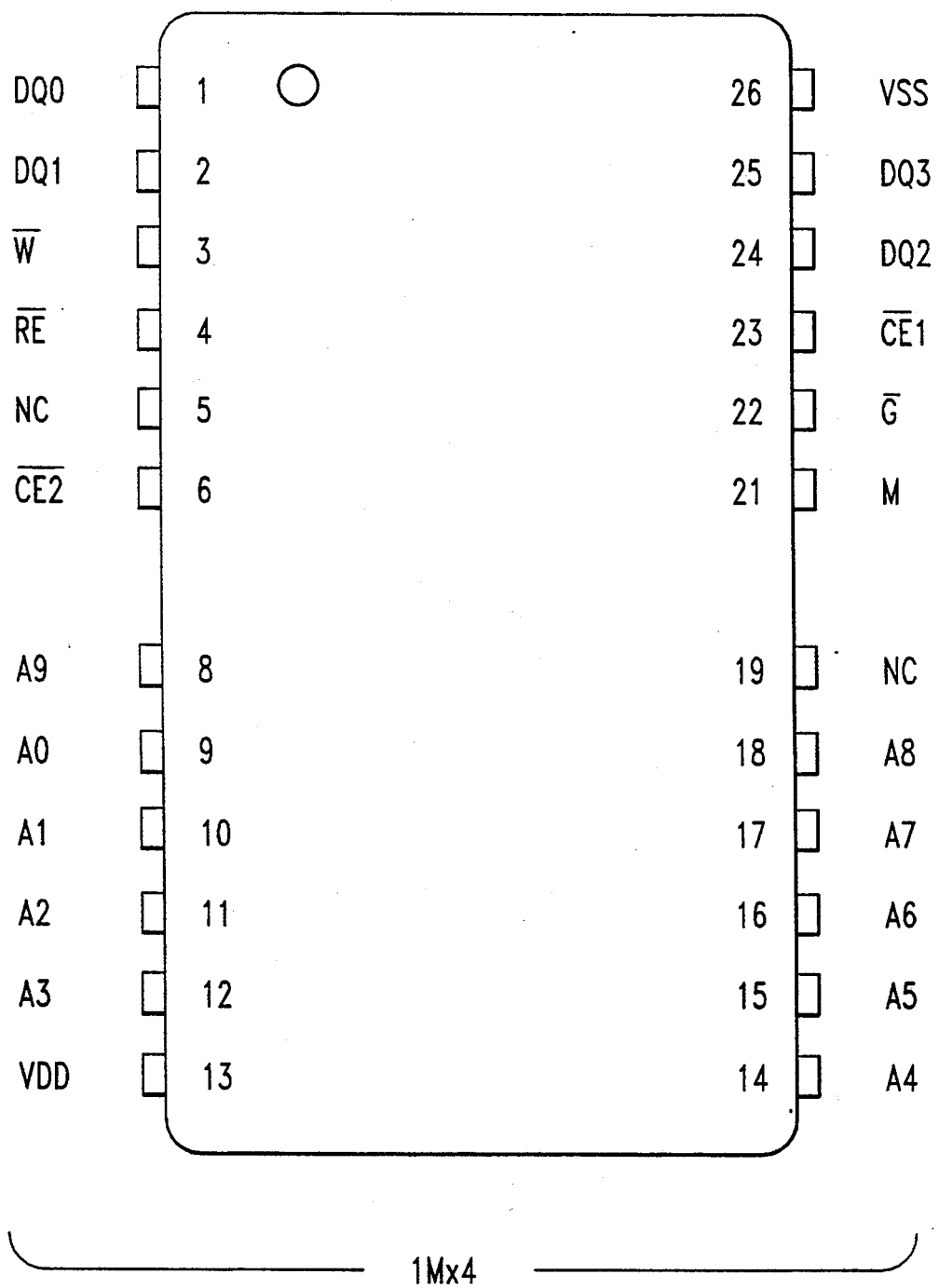
FIG. 7 is a schematic representation of another packaged memory chip illustrating the I/O and other input signals representative of a module including a Mode selection input.

In the application of the invention it is desirous that chip part numbers be minimized and a provision is provided to accomodate this feature. Referring again to FIG. 3, it will be seen that the X4 chips could be provided by modifying the X3/X1 chips to act as X4 chips. This may be accomplished by the simple addition of minimial logic circuits to each configurable chip, as illustrated in FIG. 6. FIG. 6 shows a modification of the data I/O circuits in the Chip of FIG. 1 in which a mode control signal is provided to enable the control of one of the data I/O circuits such that when the mode control signal is in one state the output of logic gate 50 enables the data I/O for DQ1 to be responsive to the CAS0 clock signal. Under such conditions the DRAM chip operates as previously described. When the mode control is in the opposite state, the data I/O for DQ1 is responsive to CAS1 and enables DQ1 at the same time as the remaining data I/O circuits. As such the chip responds as a X4 chip. Utilizing a mode control input allows the same chip part number to be utilized for all of the chips used in the SIMM of FIG. 3. A chip package pin out illustrating use of the Mode pin M is shown in FIG. 7. The desired mode control signal can easily be applied at the SIMM level by coupling the mode control pin M to a fixed voltage source.

A characteristic of the invention is that in each multi-chip module (SIMM) there are configured chip architectures comprising multiples of odd data I/O combinations. This characteristic is required in order to provide the necessary 9-bit bytes for system use.

A significant advantage of the invention is the fact that each chip is required to include a provision for only one extra, or two CAS inputs, thus allowing alternative packaging schemes to more suitably be designed. A problem in the Quad CAS solution is that three additional input pads are required to be dedicated to the additional CAS inputs for a "Quad CAS" design. Utilization of X8 "Octal CAS" adds a requirement for seven additional CAS input to each chip.

Those skilled in the art will also realize that the invention may also be combined with the concepts of the prior art techniques should one choose to utilize previous generation technology or even more complex Quad CAS architecture.

While the invention has been described in terms of limited embodiments, those skilled in the art will recognize many obvious variations in detail of the invention. For example, the use of an external CAS clocking signal may be supplemented by using internally generated clocking signals to control the data I/O circuits.

What is claimed is:

1. A semiconductor memory system comprising:
    at least one array of addressable memory cells;
    means to address a plurality of memory cells within a single memory access cycle;
    a first and a second clocking signal;
    circuit means for enabling a first odd number of said addressed cells to be accessed and for enabling a second odd number of said addressed cells to be accessed;
    said circuit means responsive to said first clocking signal for enabling said first odd number of said addressed cells to be accessed; and
    said circuit means responsive to said second clocking signal for enabling said second odd number of said addressed cells to be accessed;
    wherein one of said first and second odd numbers is greater than 1.

2. The memory system of claim 1 where said first odd number is 1 and said second odd number is 3.

3. The memory system of claim 1 where said first and second clocking signals are applied in the same memory access cycle.

4. The memory system of claim 1 wherein said first odd number is 3 and the second odd number is 5.

5. The memory system of claim 1 wherein there is provided a third clocking for enabling additional address cells to be accessed.

6. The memory system of claim 1 wherein at least one of said clocking signals is an externally applied signal.

7. The memory system of claim 6 where said externally applied signal is a column address strobe (CAS) signal.

8. The memory system of claim 1 wherein said circuit means is an input/output circuit means.

9. The memory system of claim 1 wherein there is included circuit means responsive to an applied signal for rendering said first and second clocking signals simultaneously such that the sum of said first and second odd numbers are accessed simultaneously.

10. The memory system of claim 9 wherein said applied signal is a fixed voltage level.

11. A semiconductor memory system comprising a plurality of memory sub-systems, a first sub-system comprising:
    at least one array of addressable memory cells;
    means to address a plurality of memory cells within a single memory access cycle;
    a first and a second clocking signal;
    input/output circuit means for enabling a first odd number of said addressed cells to be accessed and for enabling a second odd number of said addressed cells to be accessed;
    said input/output circuit means responsive to said first clocking signal for enabling said first odd number of said addressed cells to be accessed; and
    said input/output circuit means responsive to said second clocking signal for enabling said second odd number of said addressed cells to be accessed;
    wherein one of said first and second odd numbers is greater than 1.

12. The memory system of claim 11 wherein there is additionally provided a second memory subsystem comprising a memory array organized to provide access to an even number of data bits in responsive to at least one of said clocking signals.

13. The memory system of claim 12 wherein said clocking signals correspond to column address strobe signals applied to said system.

14. The memory system of claim 13 wherein the first and second sub-systems include memory arrays having a different number of memory cells, each array having an integral power of 2 accessable memory cells.

15. The memory system of claim 14 wherein the first and second sub-systems have memory arrays differing in number of accessable memory cells by a factor of 4.

* * * * *